United States Patent [19]

Sawada et al.

[11] 4,451,786
[45] May 29, 1984

[54] HIGH SENSITIVITY BRUSH ARCING MONITOR FOR A DYNAMOELECTRIC MACHINE

[75] Inventors: Fred H. Sawada, Scotia; James S. Bishop; Llewellyn A. Blaize, both of Schenectady, all of N.Y.

[73] Assignee: General Electric Company, Schenectady, N.Y.

[21] Appl. No.: 353,238

[22] Filed: Mar. 1, 1982

[51] Int. Cl.³ .................. G01R 31/02; G08B 21/00
[52] U.S. Cl. .................. 324/158 MG; 340/635; 340/648; 361/21
[58] Field of Search .................. 324/158 MG, 102; 340/635, 648, 662; 322/99; 361/20, 21; 307/358, 359; 328/147

[56] References Cited

U.S. PATENT DOCUMENTS 4,058,804 11/1977 Sawada et al. .................. 340/248 A
4,163,227 7/1979 Sawada et al. .................. 340/662
4,187,461 2/1980 Cox .................. 324/102
4,204,156 5/1980 Sawada et al. .................. 324/158 MG
4,342,960 8/1982 Sawada .................. 324/158 MG Primary Examiner—Ernest F. Karlsen
Attorney, Agent, or Firm—John F. Ahern

[57] ABSTRACT

High noise immunity instrumentation for monitoring brush arcing in a dynamoelectric machine is disclosed. In a preferred form the instrumentation includes a stabilized variable threshold discriminator operative in conjunction with a feedback network and a non-linear high frequency amplifier to provide a discriminator threshold which increases with increasing levels of background noise so that only the arc indicative portions of the signal are passed. A substantial increase in the signal to noise ratio is obtained. The feedback network includes a relatively long time constant integrator and buffer amplifier. Further, to provide an alarm upon the occurrence of brush arcing, an alarm network is provided which includes a comparator for continuously comparing the arc indicative signal with a reference signal which is automatically adjusted to compensate for changes in the average level of the signal from the non-linear high frequency amplifier. This compensation provides for automatically resetting the alarm comparator. This is achieved by providing a second integrator having a time constant somewhat longer than the first integrator. By appropriately selecting the relative time constants of the first and second integrators, resolution of the alarm network is narrowed to a unit time basis, thus quantifying the measurement to provide an indication of the condition of the brushes.

10 Claims, 7 Drawing Figures

HIGH SENSITIVITY BRUSH ARCING MONITOR FOR A DYNAMOELECTRIC MACHINE

BACKGROUND OF THE INVENTION

This invention relates to apparatus for monitoring arcing of brushes in dynamoelectric machines.

Electrically conductive brushes are used in dynamoelectric machines, such as turbine-driven generators, to conduct current to and from collector slip rings or commutators mounted on the generator rotor. As a result of brush wear, misalignment, slip ring imperfections, rotor vibrations, and so forth, arcing may occur between brushes and the rotating slip ring or commutator surface upon which the brushes ride during operation. This brush arcing, even if of low voltage potential, may cause deterioration of the slip ring surfaces and may, if undetected and corrective action not quickly taken, lead to excessive arcing and possible damage to slip rings and brush holder riggings, forcing generator outages and expensive repairs. Thus, early detection of brush arcing is of considerable importance.

To achieve early detection of brush arcing, instrumenta-tion has, over time, been developed to monitor the composite electrical waveform produced at a brush (or bank of brushes) during generator operation and to respond to changes in the waveform which are characteristic of brush arcing. Although advances have been made which permit the extraction of arcing information from the composite signal even in the presence of high amplitude noise spikes and in the presence of a certain amount of noise falling within the same frequency band as does the arcing portion of the signal, difficulties are still experienced at times in distinguishing the arcing component from other, background high frequency noise components inherent in the brush signal. For example, it has proven to be particularly difficult to separate the arcing component from high frequency noise components which increase in magnitude as the electrical load on the generator is increased. Viewed somewhat differently, the signal to noise ratio of the composite signal is so low under some generator operating conditions that the arc indicative portion of the signal cannot be confidently distinguished from the noise.

In U.S. Pat. No. 4,163,227 (which represents a significant advancement in arc monitors over earlier systems using gating techniques) signal processing circuitry is disclosed which provides an enhanced signal to noise ratio by carefully conditioning the composite brush signal to remove low frequency components and large voltage spikes. Among the signal conditioning circuitry disclosed, a discriminator network is included to limit the processed signal to components of one polarity. The discriminator establishes a low threshold level to ensure that even the lowest arc signal components are passed to the indicating and alarm sections of the monitor. A problem arises with this scheme, however, in that the discriminator's low threshold provides no barrier to the type of noise, mentioned above, which increases with generator load and which falls in a frequency band near that of the arc signal.

Further, an arc monitor as described in the aforementioned patent, U.S. Pat. No. 4,163,227, has not been able to provide high resolution of the arc signal. That is, such prior art monitors have not been fully capable of distinguishing a few bursts of arcing from sustained arcing over a relatively longer time period and have not had the capability of determining the amount of arcing on a unit time basis. This capability is particularly important since it provides an indication of the condition of the brushes.

Accordingly, it is the general object of the present invention to provide improved circuitry for brush monitoring instrumentation of the type generally described above, to thus overcome the shortcomings associated with such prior art instrumentation, and to provide a greater capability for detecting low levels of brush arcing in a dynamoelectric machine before severe permanent damage is caused.

A more particular object of the invention is to provide brush arc monitoring circuitry which is able to distinguish arcing components of a composite brush signal from inherent noise components particularly of the type which increase in amplitude and duration as load on the monitored machine is increased.

A further object of the invention is to provide sufficient resolution in brush monitoring apparatus so that shorter, individual bursts of brush arcing can be differentiated from more sustained periods of arcing thereby permitting determinations of arcing on a unit time basis.

Still further objects and advantages of the invention will be apparent to those of skill in the art from the ensuing description of the principles and operation of the invention and of a preferred embodiment thereof.

SUMMARY OF THE INVENTION

Brush arc monitoring apparatus according to the invention includes, in a preferred embodiment, signal conditioning circuitry for receiving a composite brush signal from monitored brushes and for moving from the signal low frequency components and recurring high voltage noise spikes; a stabilized variable threshold discriminator operative in conjunction with a feedback network including a relatively long time constant integrator and buffer amplifier to provide a discriminator threshold which increases with increasing levels of background noise so that only the arc indicative portions of the signal are passed, thus substantially increasing the signal to noise ratio; a non-linear high frequency amplifier receiving the discriminated signal and providing high gain for low level input signals and very low gain for high level input signals; and a short time constant first integrator for integrating the output signal from the non-linear amplifier to provide a signal indicative of brush arcing. Further, to provide an alarm upon the occurrence of brush arcing, an alarm network is provided which includes a comparator for continuously comparing the arc indicative signal with a reference signal which is automatically adjusted to compensate for changes in the average level of the output signal from the non-linear high frequency amplifier. This compensation provides for automatically quenching (i.e., resetting) the alarm comparator. Such quenching is achieved by providing a second integrator having a time constant somewhat longer than the first integrator. The second integrator output signal is summed with a fixed reference value to provide the automatically adjustable reference. By appropriately selecting the relative time constants of the first and second integrators, resolution of the alarm network is narrowed to a unit time basis, thus quantifying the measurement to provide an indication of the condition, or quality, of the brushes.

BRIEF DESCRIPTION OF THE DRAWINGS

While the specification concludes with claims particularly pointing out and distinctly claiming the subject matter of the invention, the invention will be better understood from the following description taken in connection with the accompanying drawings in which:

DETAILED DESCRIPTION OF THE INVENTION

Figure 1:
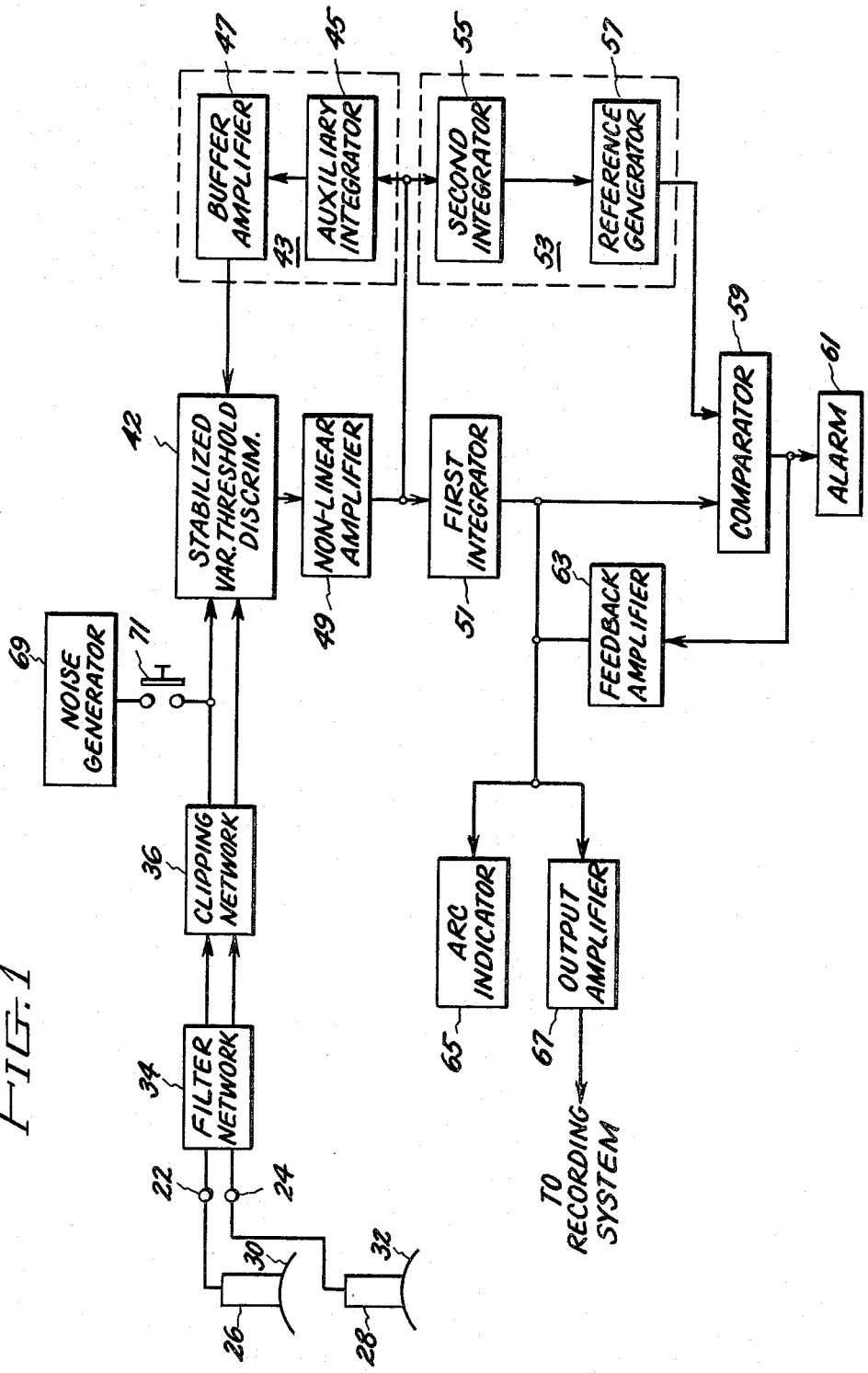
FIG. 1 is a block diagram of a preferred embodiment of the invention.

As shown in FIG. 1, a preferred embodiment of the arc monitoring apparatus includes inputs 22 and 24 for receiving composite signals from positive and negative brushes 26 and 28, each of which may comprise a polarity of brushes connected in parallel, and which, during operation, bear in a conventional manner against rotating collector slip rings 30 and 32 of the generator, the remainder of which is not shown.

The composite brush signals have been described in detail in the above-mentioned U.S. Pat. No. 4,163,227, to Sawada et al, the disclosure of which is incorporated herein by reference. Generally, in addition to an inherent noise component, these signals include high amplitude recurring voltage spikes from the generator excitation system, low frequency components, and, if arcing is occurring at the brushes, a relatively low level, high frequency component caused by the arcing. It is the latter component of the brush composite signal which is sought to be detected and which may be, for present purposes, viewed as the information content of the composite signal. Thus, all other components of the composite brush signal are regarded as noise whose presence hinders an accurate detection of brush arcing. As has been pointed out in the aforementioned Sawada et al patent, the signal to noise ratio is very small in the composite signal.

In the block diagram of FIG. 1, the composite signals received at inputs 22 and 24 from brushes 26 and 28 are fed to a dual-channel filter network 34 which removes low frequency components. The filtered signals then enter clipping network 36 which also includes two signal channels and wherein all signal components above a preselected amplitude are attenuated down to that amplitude. Filter network 34 and clipping network 36 are substantially identical to the corresponding networks disclosed in the above-referenced Sawada et al patent. As described therein, these networks 34 and 36 provide an enhancement of the signal to noise ratio in the brush signal.

The conditioned signals from clipping network 36 pass to dual-channel stabilized variable threshold discriminator 42 which acts to discriminate against all portions of the conditioned signals which are below a threshold level. The threshold, although the same for each channel, is not fixed is automatically varied up or down depending on the average level of background noise in the conditioned signals applied to the discriminator inputs. Since the arc signal and the background noise are additive, the high frequency pulses caused by brush arcing ride up and down superimposed on the background noise which is also relatively high in frequency. The variable threshold effectively tracks the upper levels of the background noise signal so that all of the arc pulses are passed while the background noise is discriminated against. In addition, means are provided within the discriminator 42 to fully stabilize the threshold against changes which might otherwise be brought on by changes in ambient operating temperature. The two discriminator signals, after being acted upon by the discriminator 42, are brought together to form a single signal at the discriminator output. The signal of greater magnitude at any instant of time is passed on to the non-linear amplifier 49.

The variable threshold for discriminator 42 is established by feedback network 43 which includes an auxiliary integrator 45 and a buffer amplifier 47. The input signal to the feedback network 43 is taken from non-linear amplifier 49 which has a gain characteristic such that low input signal levels receive a large amplification while high input signal levels receive little or no amplification. Auxiliary integrator 45 is a peak integrator having a relatively long time constant and provides a time varying dc output which is proportional to the average value of the amplified signal from the non-linear amplifier 49. The resultant time varying signal is applied via buffer amplifier 47 to discriminator 42 which is adapted to adjust its threshold level up or down depending on the signal level from the buffer amplifier 47. The circuitry and operation of discriminator 42, feedback network 43, and non-linear amplifier 49 are more fully described herein below.

The output signal from the non-linear amplifier 49, in addition to being applied to feedback network 43, is also applied simultaneously to first integrator 51 and to a reference network 53 which includes second integrator 55 and reference generator 57. The output signal from the first and second integrators, 51 and 55 respectively, are time varying dc signals indicative of the brush arcing content of the composite brush signals applied to the input terminals 22 and 24. However, the time constants of integrators 51 and 55 are considerably different and are chosen so that first integrator 51 has a much shorter time constant than does second integrator 55. Thus, first integrator 51 is able to respond to short, quick bursts of brush arcing and provide an output signal accordingly. Second integrator 55 responds to longer bursts of arcing and takes a considerably longer time to build up a proportional dc output signal. It has been found for example that in monitoring the brushes of large turbine driven generators, time constants of one and thirty milliseconds for integrators 51 and 55, respectively, provide very satisfactory results.

The output signal from second integrator 55 is applied to reference generator 57 wherein the integrated signal is summed with a preselected, fixed signal value so that the output signal from reference generator 57 represents the integrated signal from integrator 55 but with an elevated base line. The base line is determined by the preselected, fixed signal value of reference generator 57. The output signal from reference generator 57 is applied as one input to comparator 59.

The second input to comparator 59 is the short term integrated signal from first integrator 51. Comparator 59 is operative to compare the magnitudes of the two input signals and to activate alarm 61 whenever the signal from first integrator 51 is greater than the signal from reference generator 57. When arcing occurs at the brushes (either brush 26 or brush 28) first integrator 51 responds relatively quickly, the first input to comparator 59 therefore increases faster than does the second input and alarm 61 is triggered. If the brush arcing continues, the output signal from second integrator 55 will build up and the integrated signal, elevated by fixed amount in reference generator 57 will rise until it is substantially equal in amplitude to the signal from the first integrator. Thus, with the two inputs to comparator 59 substantially equal in magnitude, comparator 59 will be reset or quenched and alarm 61 deactivated. Alarm 61 is an audable/visual alarm to alert operating personnel that brush arcing is occurring. The rate at which alarm 61 is triggered on and off is an indication of the number of arc incidents per unit time.

A feedback amplifier 63 responds to the output of comparator 61 and feeds back a signal to reinforce the arc indicative signal appearing at the output of first integrator 51. This arc indicative signal is applied in parallel to an arc indicator 65 (which may simply be an analog type meter) and to an output amplifier 67 which produces an appropriate signal for recording or for serving as an input to a computer. For example, the output signal from output amplifier 67 may be a conventional 4–20 milliamp signal.

To permit testing of most of the circuitry described above without actually inducing arcing of brushes 26 and 28, noise generator 69 is provided. When coupled to discriminator 42 by the closure of switch 71, noise generator 69 applies high frequency signals similar to low level brush arcing to discriminator 42 and, provided the arc detection circuitry is functioning properly, will result in actuation of alarm 61 and arc indicator 65. The noise generator 69 is in all respects equivalent to the corresponding noise generator in the above referenced 4,163,227 patent.

Figure 2:
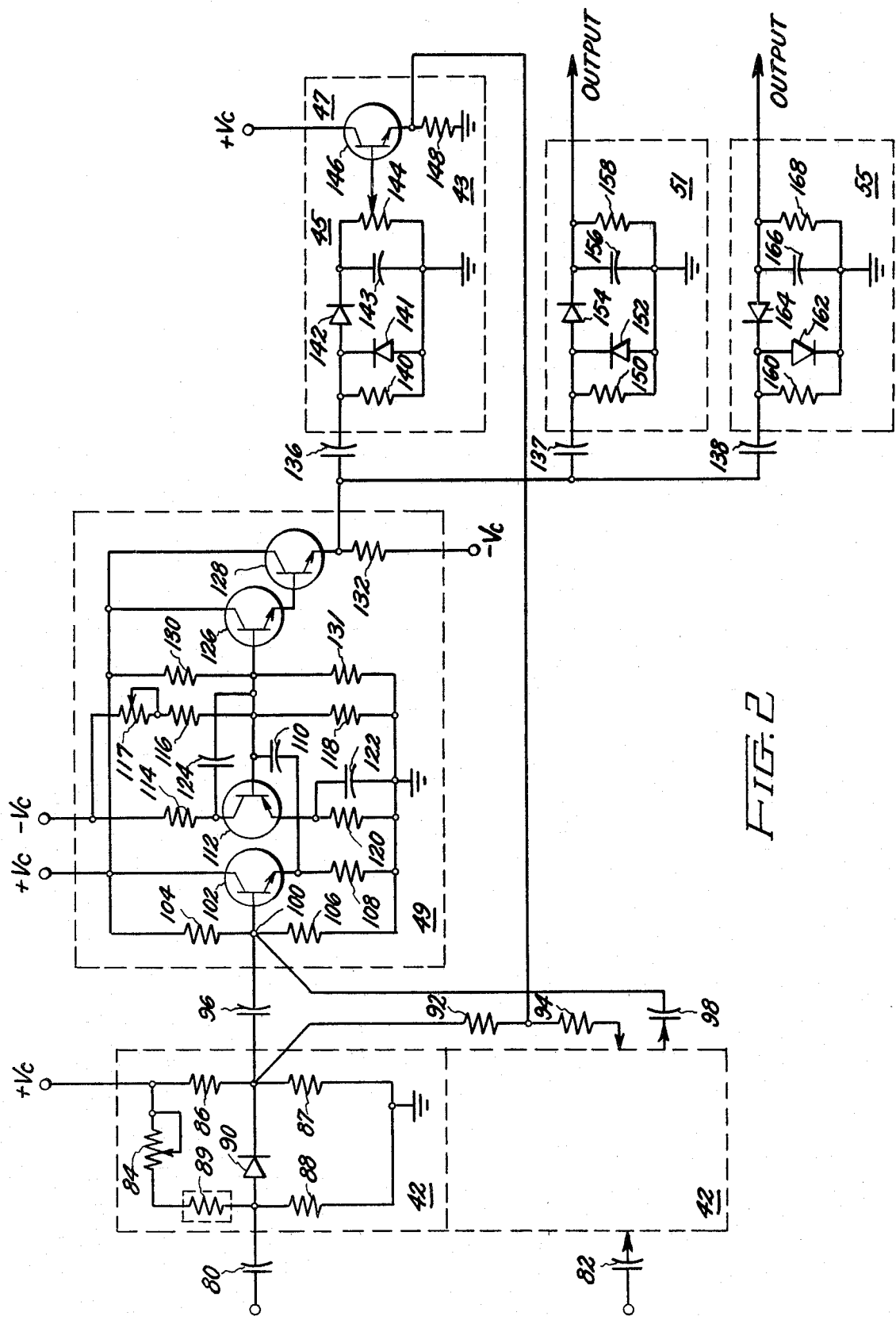
FIG. 2 is a detailed circuit diagram of portions of the preferred embodiment of FIG. 1.

Referring now to FIG. 2, one of the conditioned brush signals from the clipping network 36 (of FIG. 1) is applied through coupling capacitor 80 to one channel of the other conditioned signal is applied through coupling capacitor 82 to the second discriminator channel. Since both channels of the discriminator are substantially identical, only one will be described in detail. Thus the discriminator network receiving a signal through capacitor 80 includes variable resistor 84; fixed resistors 86, 87, and 88; temperature dependent resistor 89; and diode 90. The resistance values of the fixed resistors 86–88 in combination with the resistance setting of variable resistor 84 and the resistance of temperature dependent resistor 89 (at any given temperature) are selected such that the diode 90 is normally slightly forward biased when no input signal is present. That is, under zero signal conditions the anode end of diode 90 is slightly more positive then the cathode end. This forward bias condition ensures that even very small positive signals will be conducted through the diode 90 while all negative going components are totally blocked. The forward biasing of diode 90 establishes a signal threshold which is ordinarily very low. If the background noise in the conditioned brush signal increases, however, the threshold is automatically raised by a feedback signal which acts to reduce the forward bias on diode 90 in proportion to the average value of the background noise. Raising the threshold by an appropriate amount causes the discriminator 42 to block the noise while passing the arcing content of the signal. The feedback signal which regulates the discriminator threshold is applied to the upper channel of the discriminator 42 through resistor 92 and to the lower channel through resistor 94. Operation of the discriminator 42 and generation of the feedback signal will be fully described herein below.

It may be noted at this point, however, that the discriminator 42 is also stabilized against the effects of changes in ambient temperature. Temperature dependent resistor 89 has a positive temperature coefficient of about 0.7 ohms/° C. over an ambient temperature range of about −10° C. to +150° C. In the embodiment of the brush monitoring apparatus of FIG. 2, temperature dependent resistor 89 is operable to apply a temperature varying reverse bias to compensate for the inherent change in the threshold characteristics of diode 90 of about 2MV/° C. Thus, although the discriminator threshold varies under the influence of a feedback signal, it remains unaffected by changes in ambient temperature.

The output signals of the discriminator 42 pass by way of coupling capacitors 96 and 98 to the input of non-linear amplifier 49. The signals are combined into one signal at junction 100 with the non-linear amplifier responding to the signal of greater instantaneous magnitude.

Non linear amplifier 49 includes an input transistor stage 102 configured as an emitter follower having bias resistors 104 and 106, and emitter resistor 108. The emitter follower serves as a buffer input stage between the discriminator 42 and the amplifying stages of the non-linear amplifier 49. The discriminated signal is coupled from the emitter resistor 108 through capacitor 110 into a common emitter stage including transistor 112, load resistor 114, bias resistors 116, 117, and 118, emitter resistor 120, and bypass capacitor 122. The amplified signal from transistor 112 is passed via coupling capacitor 124 to a conventional Darlington type power amplifier including transistors 126 and 128, and fixed resistors 130, 131, and 132. The amplified output signal is taken from across emitter resistor 132.

The non-linear amplifier 49, and other parts of the circuitry comprising the arc monitoring apparatus, are supplied with operating power from dc power sources (not illustrated) connected at $+V_c$ and $-V_c$, each referenced to a common grounding point. For example, plus and minus 15 volt sources may be used in the circuitry of FIG. 2.

Figure 3:
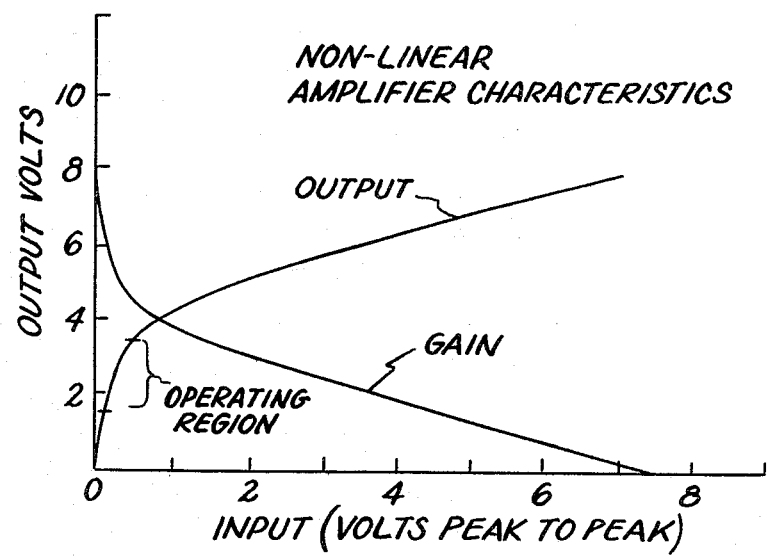
FIG. 3 is a plot of the gain characteristics of the non-linear amplifier of FIGS. 1 and 2.

FIG. 3 illustrates dynamic gain and output characteristic curves for non-linear amplifier 49. As can be seen from the curves, gain and output are functions of the input signal level. For low levels of input signal the gain is high while the magnitude of the output signal is relatively low. Conversely, at higher levels of the input signal, gain is low while the output signal remains relatively high. As will be apparent from the ensuing discussion, the characteristics of the non-linear amplifier 49 establishes an input signal level which is determinative of the feedback signal to the discriminator 42 and which, therefore, has an effect on the variable threshold level of discriminator 42.

The characteristic curves of FIG. 3 are established in a known manner by selecting the operating conditions for the common emitter stage incorporating transistor 112 as shown in FIG. 2. In one form of the invention, satisfactory results have been obtained by using a PNP 2N 2905 transistor for transistor 112, making resistor 117 a 100K ohm adjustable resistor, fixing resistor 116 at 56K ohms, bias resistor 118 at 6.2K ohms, collector load resistor 114 at 3.6K ohms, emitter resistor 120 at 360 ohms, and bypass capacitor 122 at 5600 picofarads. Power is supplied at −15 volts dc. A wide range of non-linear gain characteristics is obtained by varying resistor 117.

With further reference to FIG. 2, the output signal from non linear amplifier 49 is passed simultaneously through coupling capacitors 136, 137, and 138 to, respectively, feedback network 43 including auxiliary integrator 45 and buffer amplifier 47, first integrator 51, and second integrator 55. Each integrator, 45, 51, and 55 functions as a peak integrator in a manner similar to a filtered half-wave rectifier to produce a time varying dc output signal whose amplitude is proportional to the peak amplitude of the signal from non-linear amplifier 49.

Auxiliary integrator 45 of feedback network 43 is a relatively long time constant integrator comprised of resistor 140, bypass diode 141, rectifying diode 142, filter capacitor 143, and adjustable output resistor 144. The time constant of integrator 145 is determined principally by the component values of capacitor 143 and resistor 144 and may, for example, by on the order of ten seconds or more. This relatively long time constant prevents the integrator 45 from responding to short bursts of brush arcing but allows the output signal at resistor 144 to slowly build up in the face of sustained arcing or during long periods of background high frequency noise.

The output of auxiliary integrator 45 is applied to buffer amplifier 47 configured as an emitter follower formed from transistor 146 and resistor 148. The buffer amplifier 47 provides electrical isolation between auxiliary integrator 45 and the discriminator 42. Discriminator 42 receives the auxiliary integrator signal through resistors 92 and 94, as discussed above, to effect changes in the discriminator threshold.

Figure 4A:
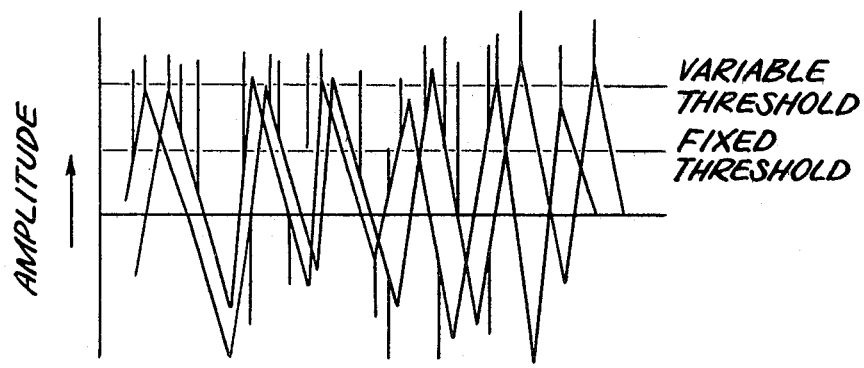
FIGS. 4a–4c are illustrations of a conditioned brush signal comparing the effects of a fixed discriminator threshold and a variable discriminator threshold, the latter according to the present invention, on that signal.
Figure 4B:
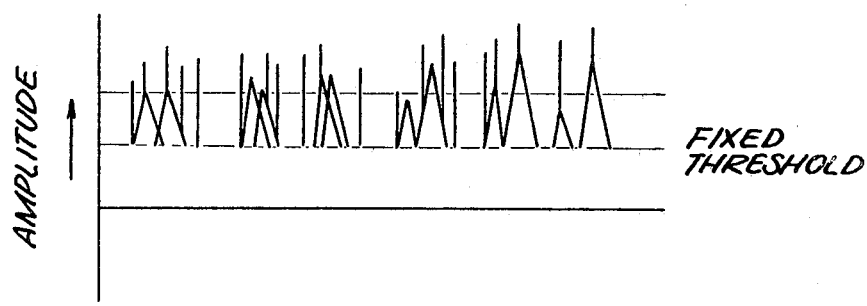
Figure 4C:
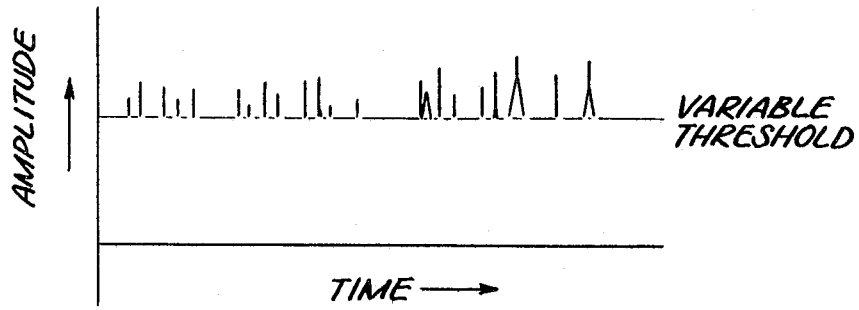

FIGS. 4a, 4b, and 4c illustrate the effect of the variable threshold. FIG. 4a is a typical waveform for the conditioned brush signal emerging from one channel of the clipping network 36 of FIG. 1. The signal consists of a large amount of inherent background noise generally in the form of a triangular wave. This background noise is of relatively high frequency and low voltage so that it is not removed by the signal conditioning networks, i.e., by filter network 34 and clipping network 36. Furthermore, the background noise is related to the load on the generator being monitored and, under some generator operating conditions may not be present. However, if it is present it tends to increase in amplitude with generator loading. The arcing components of the signal consist of high frequency spikes superimposed on the background noise.

FIG. 4b illustrates the effect on the conditioned signal of a discriminator network of a type known in the art and having a fixed threshold level. The fixed threshold is at some positive amplitude level low enough to ensure capture of essentially all of the arcing spikes even in the absence of background noise. As can be seen from FIG. 4b, however, this also ensures that a portion of the background noise is passed. Thus, in the absence of brush arcing the background noise appears as a false indication of arcing. On the other hand, if arcing is actually present the noise tends to obscure the arcing information.

FIG. 4c illustrates the output of discriminator 42, according to the present invention, which provides a variable threshold. The threshold is automatically moved up or down, depending on the background noise level, so that substantially all the noise is removed and only the uppermost arcing spikes remain in the signal. As is illustrated, the high level of background noise has caused the threshold to be moved up.

Returning to FIG. 2, the variable threshold is established most effectively by combining operation of the feedback network 43 with operation of the non-linear amplifier 49. As the background noise component grows in amplitude the output of the non-linear amplifier 49 increases in magnitude even though it is momentarily operating in a low gain region. See FIG. 3, for example. If the background noise signal from the non-linear amplifier 49 is sustained for a period of time, it is converted to a proportional time varying dc voltage by auxiliary integrator 45. This voltage is applied through buffer amplifier 47 and resistors 92 and 94 to the discriminator 49 wherein the feedback voltage is effective to decrease the forward bias on the discriminator diode 90. The discriminator diodes may in fact be reverse biased by the feedback voltage. Thus, the discriminator threshold is raised so that only the uppermost part of the signal is passed as illustrated in FIG. 4c. With only the low amplitude arcing spikes as an input signal the non-linear amplifier 49 is returned to operation in the high gain region of its gain characteristic. It will be realized of course that all of this action, with the exception of the integration action, occurs substantially instantaneously. The auxiliary integrator, 45 once having built up an output signal continues to hold that signal because of the integrator's long time constant. Variable resistor 144 is adjusted under high background noise conditions to achieve just enough feedback to maintain the non-linear amplifier 49 in its high gain region, i.e., between about 1.5 and 3.5 volts on the output curve of FIG. 3.

The first integrator 51 provides an output signal indicative of brush arcing for display and alarm purposes and as illustrated in FIG. 2 includes input resistor 150, bypass diode 152, rectifying diode 154, filter capacitor 156, and output resistor 158. The second integrator 55 provides an output signal for generating a reference signal which is compared with the arc indicative signal from first integrator 51 and includes input resistor 160, bypass diode 162, rectifying diode 164, filter capacitor 166, and output resistor 168. It will be noted that the outputs of the first and second integrators 51 and 55 are of opposite polarity. Further, as noted above, although both the first integrator 51 and the second integrator 55 respond rather quickly (i.e., with a short time constant), the second integrator 55 responds relatively slower.

Other functional circuits of the brush monitoring apparatus of FIG. 1 (with the exception of output amplifier 67 which is of conventional design), including reference generator 57, comparator 59, alarm 61, feedback amplifier 63, and arc indicator 65, are substantially identical to the corresponding circuits in the above referenced patent, U.S. Pat. No. 4,163,227 to Sawada et al and need not be discussed in detail herein. However, by giving the first and second integrators, 51 and 55 respectively, much shorter response times then are disclosed in the Sawada et al patent, and by making the relative response times between these integrators about 30 to 1, it has been discovered that much higher resolution can be attained with comparator 59, alarm 61, and arc indicator 55. Indeed, it has been found that very short individual bursts of brush arcing can be detected and resolved.

Figure 5:
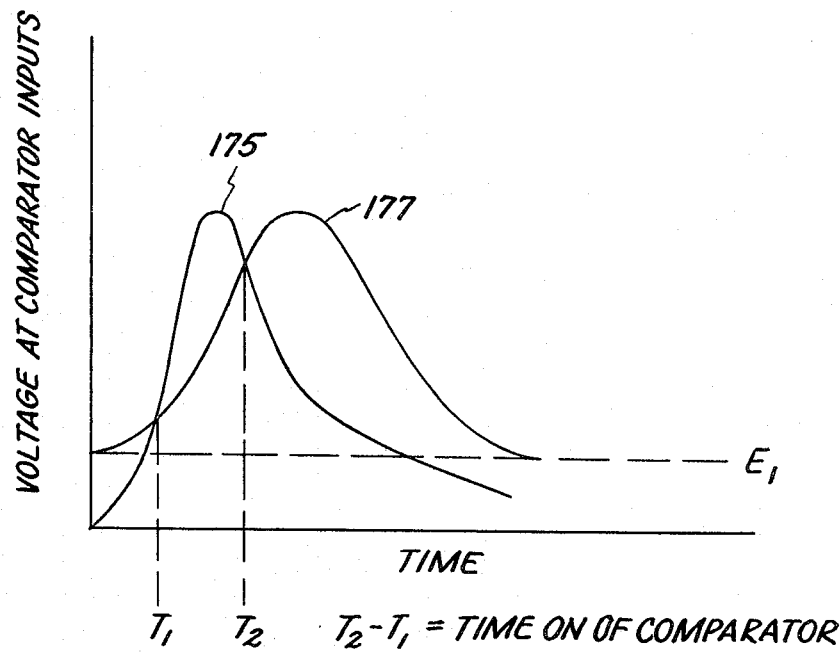
FIG. 5 illustrates curves pertaining to the operation of the comparator and alarm circuitry of FIG. 1.

FIG. 5 may be referred to for an understanding of how the resolution time of comparator 59 of FIG. 51 is determined. Curve 175 represents the time varying dc voltage from the first integrator 51 which is applied to one input of the comparator 59 during a burst of brush arcing. The curve of 175 rises from essentially a zero baseline fairly rapidly at a rate determined by the time constant of the first integrator 51. Curve 177 represents the time varying dc voltage from the reference generator 57 which is applied to the other input of the comparator 59. Curve 177 rises at a slower rate from an elevated baseline $E_1$ which is a fixed increment provided by reference generator 57 in the manner described in the Sawada et al patent. The rate of rise of curve 177 is determined by the time constant of second integrator 55. At time $T_1$ curve 175 exceeds the magnitude of curve 177 and the comparator 59 is activated. This triggers alarm 61 and, through feedback amplifier 63, arc indicator 65. Subsequently, at time $T_2$, curves 175 and 177 again are of equal magnitude and the comparator is reset deactivating alarm 161.

It has been found, for example, that by setting the time constant of first integrator 51 at about one millisecond and second integrator 55 at about 30 milliseconds, brush arcing in large power generators can be determined on a unit time basis. That is, the number of arcs per minute or second can more readily be determined. This information provides an indication of the condition of the brushes which indication was not available with prior art brush monitoring apparatus.

While the invention has been described in detail with reference to a specific preferred embodiment, it is understood that various modifications will be apparent to those skilled in the art of brush monitoring systems. It is intended to claim all such modifications which fall within the true spirit and scope of the present invention.

The invention claimed is:

1. In apparatus for monitoring arcing of brushes in an electrical generator, such apparatus being of the type including means receiving from at least one brush a composite signal comprised of high frequency brush arcing components, low frequency components, noise spikes, and high frequency background noise whose amplitude depends upon generator loading; signal conditioning means removing said low frequency components and attenuating said noise spikes to a preselected amplitude to provide a conditioned signal; a discriminator network having a signal threshold limiting said conditioned signal to signal components of one polarity above said threshold; an amplifier producing an amplified signal from the conditioned signal from said discriminator; and a first integrator integrating said amplified signal to produce a first integrated signal indicative of brush arcing; an improvement comprising:
a feedback network including an auxiliary integrator for integrating said amplified signal to provide a feedback bias signal indicative of the background noise contained in said amplified signal, and a buffer amplifier for applying said feedback bias signal to said discriminator, said discriminator being responsive to said feedback bias signal to vary said threshold level up or down as a function of said signal.

2. The apparatus of claim 1 wherein said amplifier comprises a high frequency non-linear amplifier having higher gain at low levels of said conditioned signal and lower gain at high levels of said conditioned signal.

3. The apparatus of claim 2 further comprising:
a second integrator responsive to said amplified signal to produce a variable reference signal whose amplitude is indicative of brush arcing, said second integrator having a longer time constant than said first integrator to delay the response of said reference signal relative to said first integrated signal; and
a comparator network operable to compare said first integrated signal with said variable reference signal to produce an alarm signal whenever said first integrated signal exceeds said reference signal.

4. The apparatus of claim 3 wherein said discriminator network includes a diode whose bias condition is effected by said feedback bias signal thereby to vary said threshold level.

5. The apparatus of claim 4 wherein said buffer amplifier comprises an emitter follower transistor circuit.

6. The apparatus of claims 1, 2, or 5 wherein said auxiliary integrator has a time constant which is long relative to the period of the arcing and background noise content of said composite signal.

7. The apparatus of claim 6 wherein the time constant of said second integrator is about 30 times as long as the time constant of said first integrator.

8. The apparatus of claim 7 wherein the time constant of said first integrator is about 1 millisecond.

9. The apparatus of claim 6 wherein said discriminator network includes temperature compensating means for stabilizing the threshold level against changes in ambient temperature.

10. The apparatus of claim 9 wherein the high frequency non-linear amplifier comprises a 3-stage transistor amplifier including an emitter follower first stage, a common emitter second stage determining the non-linear gain characteristics of said amplifier, and a power amplifier third stage.

* * * * *